US011655561B2

(12) United States Patent
Suo et al.

(10) Patent No.: US 11,655,561 B2
(45) Date of Patent: May 23, 2023

(54) N-TYPE 4H—SIC SINGLE CRYSTAL SUBSTRATE AND METHOD OF PRODUCING N-TYPE 4H—SIC SINGLE CRYSTAL SUBSTRATE

(71) Applicant: SHOWA DENKO K.K., Tokyo (JP)

(72) Inventors: Hiromasa Suo, Hikone (JP); Kazuma Eto, Tsukuba (JP); Tomohisa Kato, Tsukuba (JP)

(73) Assignee: SHOWA DENKO K.K., Tokyo (JP)

( * ) Notice: Subject to any disclaimer, the term of this patent is extended or adjusted under 35 U.S.C. 154(b) by 528 days.

(21) Appl. No.: 16/553,302

(22) Filed: Aug. 28, 2019

(65) Prior Publication Data

US 2020/0071849 A1 Mar. 5, 2020

(30) Foreign Application Priority Data

Aug. 30, 2018 (JP) .............................. JP2018-161554

(51) Int. Cl.
  *C30B 29/36* (2006.01)
  *C01B 32/956* (2017.01)
  *C30B 23/06* (2006.01)

(52) U.S. Cl.
  CPC ............ *C30B 29/36* (2013.01); *C01B 32/956* (2017.08); *C30B 23/066* (2013.01); *C01P 2002/54* (2013.01); *C01P 2006/40* (2013.01)

(58) Field of Classification Search
  CPC ......... H01L 21/02447; H01L 21/02529; H01L 21/02576; C30B 29/36; C30B 23/066; C01B 32/956; C01P 2002/54; C01P 2006/40
  See application file for complete search history.

(56) References Cited

U.S. PATENT DOCUMENTS

2015/0225873 A1   8/2015  Fujiwara et al.
2016/0122901 A1*  5/2016  Danno ................... C30B 29/36
                                                                         117/60

FOREIGN PATENT DOCUMENTS

| CN | 101896647 A   | 11/2010 |
| CN | 105492667 A   | 4/2016  |
| CN | 107208311 A   | 9/2017  |
| CN | 108026661 A   | 5/2018  |
| JP | 2009-167047 A | 7/2009  |
| JP | 4469396 B     | 5/2010  |
| JP | 2013-095632 A | 5/2013  |
| JP | 2014-24704 A  | 2/2014  |
| JP | 2015-030640 A | 2/2015  |
| JP | 2017-065996 A | 4/2017  |

OTHER PUBLICATIONS

Bulk Growth of Low Resistivity n-Type 4H—SiC Using Co-Doping, Suo et al., 2017, Materials Science Forum ISSN: 1662-9752, vol. 897, pp. 3-6.*

Office Action dated Dec. 30, 2020 from the China National Intellectual Property Administration in CN Application No. 201910802908.7.

H. Suo et al., "Difference of double Shockley-type stacking faults expansion in highly nitrogen-doped and nitrogen-boron co-doped n-type 4H—SiC crystals", Journal of Crystal Growth, 2017, vol. 468, pp. 879-882.

Office Action dated Jun. 7, 2022, issued in Japanese Application No. 2018-161554.

* cited by examiner

*Primary Examiner* — Haidung D Nguyen

(74) *Attorney, Agent, or Firm* — Sughrue Mion, PLLC

(57) ABSTRACT

In an n-type 4H-SiC single crystal substrate of the present disclosure, the concentration of the element N as a donor and the concentration of the element B as an acceptor are both $3 \times 10^{18}/cm^3$ or more, and a threading dislocation density is less than $4,000/cm^2$.

8 Claims, 4 Drawing Sheets

N-TYPE 4H—SIC SINGLE CRYSTAL
SUBSTRATE AND METHOD OF
PRODUCING N-TYPE 4H—SIC SINGLE
CRYSTAL SUBSTRATE

CROSS-REFERENCE TO RELATED
APPLICATION

Priority is claimed on Japanese Patent Application No. 2018-161554, filed Aug. 30, 2018, the content of which is incorporated herein by reference.

BACKGROUND

Field of the Invention

The present disclosure relates to an n-type 4H-SiC single crystal substrate and a method of producing an n-type 4H-SiC single crystal substrate, and particularly, to an n-type 4H-SiC single crystal substrate in which a donor and an acceptor are co-doped.

Description of Related Art

Compared to silicon (Si), silicon carbide (SiC) has an insulation breakdown electric field that is one digit larger and three times the band gap. In addition, silicon carbide (SiC) has characteristics such as a thermal conductivity that is about three times that of silicon (Si). Therefore, silicon carbide (SiC) is expected to be applied to a power device, a high frequency device, a high temperature operation device, and the like.

A SiC single crystal has a polymorphism such as 3C-SiC, 4H-SiC, and 6H-SiC. Among these polymorphisms, particularly, a 4H-SiC single crystal has high mobility and is expected to be used for a power device.

In order to produce a SiC power device or the like, depending on the structure of the device, not only an n-type single crystal substrate but also a p-type single crystal substrate is required. However, many studies have been conducted in which, in order to facilitate production, an n-type SiC single crystal has lower dislocation and lower resistance than a p-type single crystal substrate. Therefore, when an electronic device such as a power device is produced using a SiC single crystal substrate, generally, an n-type SiC single crystal substrate with a low resistance is used as a base substrate. In the n-type SiC single crystal substrate, nitrogen is generally used as a donor element. A nitrogen atom doped in a SiC single crystal is substituted with a carbon atom and acts as a donor.

In the SiC power device, it is important to lower the resistivity of a single crystal substrate and lower a resistance value of the device. Therefore, the resistivity of the n-type SiC single crystal substrate can be lowered by increasing the concentration of nitrogen. In addition, it is known that, in order to reduce basal plane dislocation (hereinafter referred to as BPD) of a crystal and the like, a SiC single crystal is doped with an acceptor element such as an aluminum together with a donor element such as nitrogen.

Here, when the concentration of nitrogen as a donor element increases, stacking faults increase, and the crystallinity tends to decrease. Therefore, a technique in which boron (B) is added to a crystal in order to reduce BPD and double Shockley-type stacking faults (hereinafter referred to as DSSF) has been reported.

For example, it is disclosed that, when an amount of $B_4C$ mixed into a raw material is 2 mass % (N concentration: $2.7 \times 10^{19}$, B concentration: $1.5 \times 10^{19}$ $cm^{-3}$) and a crystal is grown, BPD can be reduced (Patent Document 1).

In addition, there is disclosed a SiC single crystal in which an acceptor element such as aluminum (Al) is doped in addition to a donor element such as nitrogen (N), a value obtained by subtracting the concentration of the acceptor element from the concentration of the donor element is $1 \times 10^{21}$ $cm^{-3}$ or less, and a stacking fault density is 10 $cm^{-1}$ or less (Patent Document 2).

In addition, a crystal obtained by mixing an amount of 0.05 to 0.10 mass % (N concentration: $5 \times 10^{19}$ to $11 \times 10^{19}$ $cm^3$, B concentration: $3 \times 10^{19}$ $cm^{-3}$ to $6 \times 10^{19}$ $cm^{-3}$) of $B_4C$ into a raw material is considered to have effects of lowering an expansion speed of DSSF and reducing the occurrence of stacking faults (Non-Patent Document 1).

In addition, a method is disclosed in which, in order to reduce crystal hollow defects, 2 mass % or more of a raw material used for crystal growth is sublimated in advance before use (Patent Document 3).

PATENT DOCUMENTS

[Patent Document 1] Japanese Patent No. 4469396
[Patent Document 2] Japanese Unexamined Patent Application, First Publication No. 2015-030640
[Patent Document 3] Japanese Unexamined Patent Application, First Publication No. 2013-95632

NON-PATENT DOCUMENT

[Non-Patent Document 1] Suo et al., Journal of Crystal Growth 468, 2017, pages 879 to 882

The inventors discovered phenomenon in which, when the concentration of boron in a crystal is increased by increasing an amount of $B_4C$ mixed into a raw material, threading dislocation increases at the initial stage of crystal growth, and as a result, a threading dislocation density of the grown crystal increases prior to this application. In all of Patent Documents 1 to 4, no technical idea for reducing such threading dislocation is disclosed or suggested, and there is no consideration regarding threading dislocation in a configuration in which a donor and an acceptor are co-doped.

SUMMARY

The present disclosure provides an n-type 4H-SiC single crystal substrate in which a threading dislocation density is low and the crystallinity is improved compared to the related art in a configuration in which a donor and an acceptor are co-doped, and a method of producing an n-type 4H-SiC single crystal substrate.

In order to solve the above problems, the present disclosure provides the following aspects.

[1] An n-type 4H-SiC single crystal substrate in which a concentration of a donor element and a concentration of an acceptor element are both $3.0 \times 10^{18}/cm^3$ or more, and a threading dislocation density is less than $4,000/cm^2$.

[2] A method of producing an n-type 4H-SiC single crystal substrate, including:
  a process of filling a crucible with a raw material containing a silicon source (Si), a carbon source (C), and an element as an acceptor;
  a process of pre-sublimating 0.1 mass % or more of the raw material in the crucible;
  a process of disposing a seed crystal to face the raw material; and a process of supplying a gas containing an element as a donor into the crucible, sublimating the pre-sublimated raw material in the crucible, and allowing a single crystal layer to grow on a surface of the seed crystal.

DETAILED DESCRIPTION

Embodiments of the present disclosure will be described below in detail with reference to the drawings.

Figure 1:
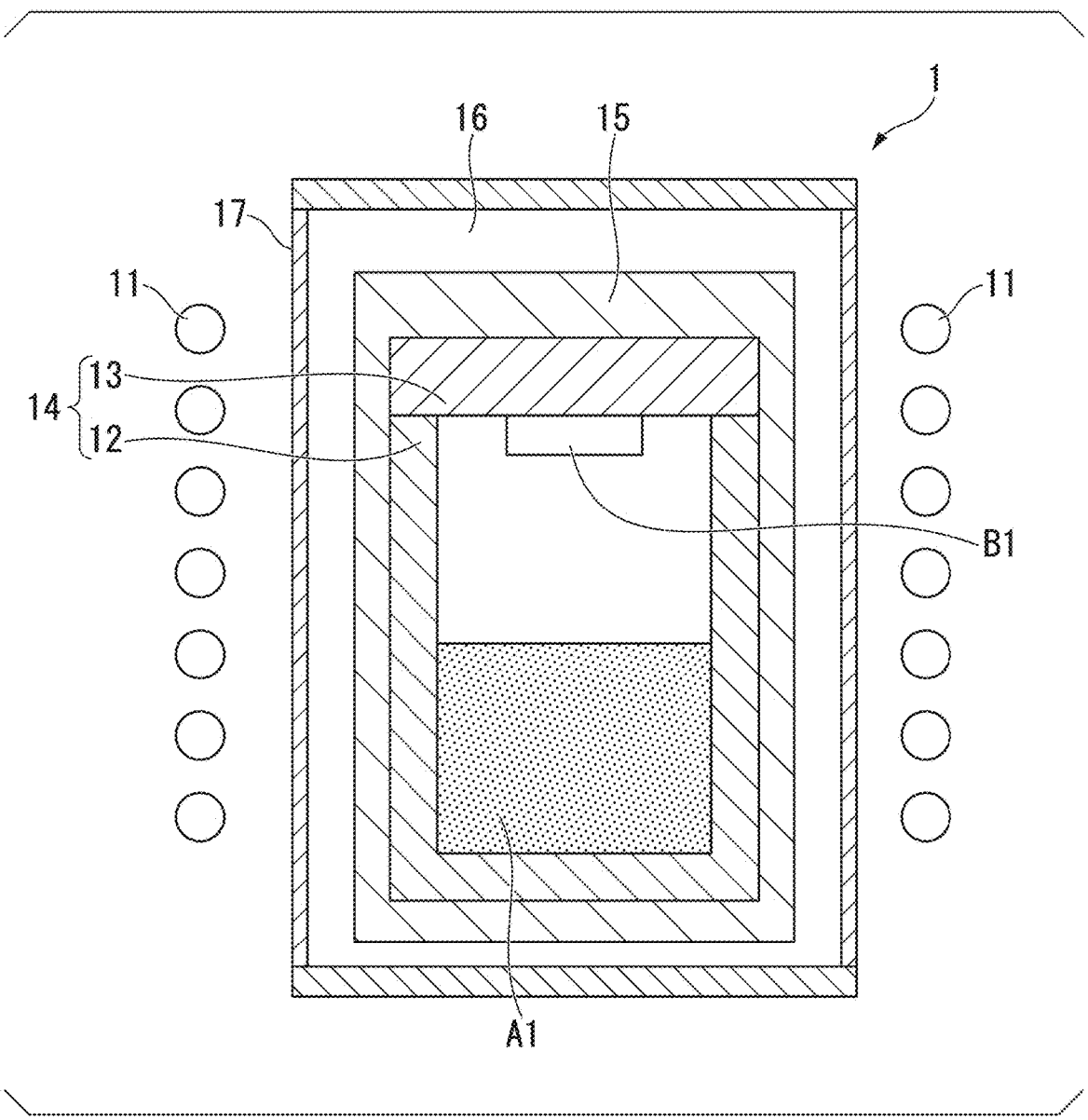
FIG. 1 is a cross-sectional view schematically showing an example of a configuration of an n-type 4H-SiC single crystal substrate production device for realizing a method of producing an n-type 4H-SiC single crystal substrate according to an embodiment of the present disclosure.

FIG. 1 is a cross-sectional view schematically showing an example of a configuration of an n-type 4H-SiC single crystal substrate production device for performing a method of producing an n-type 4H-SiC single crystal substrate according to an embodiment of the present disclosure. As shown in FIG. 1, an n-type 4H-SiC single crystal substrate production device 1 includes a high frequency coil 11, a crucible 14 including a container body 12 that can hold a raw material A1 and a lid section 13 to which a seed crystal B1 can be attached, a heat insulation section 15 that is externally fitted to the crucible 14, and a tubular body 17 that is externally fitted to the heat insulation section 15 with a space 16 therebetween.

The high frequency coil 11 heats the raw material A1 using an indirect heating method.

The crucible 14 is made of a material that is stable at a high temperature and generates a small amount of impurity gas and is made of, for example, graphite, silicon carbide, or graphite covered with silicon carbide or tantalum carbide (TaC).

The heat insulation section 15 is disposed to cover the container body 12 and the lid section 13 of the crucible 14. The heat insulation section 15 is made of, for example, a carbon fiber material, and can stably maintain the temperature of the crucible 14 in a high temperature range.

The tubular body 17 is, for example, a quartz tube that is disposed to define the space 16 between it and an insulating material 15. The space 16 is filled with a gas containing an element as a donor, for example, a mixed gas containing argon (Ar) and nitrogen (N).

The raw material A1 is, for example, a mixture containing silicon carbide (SiC) powder and boron carbide ($B_4C$) powder. The seed crystal B1 is an n-type 4H-SiC single crystal. An n-type 4H-SiC single crystal substrate can be produced using the n-type 4H-SiC single crystal substrate production device 1 configured as described above.

Figure 2:
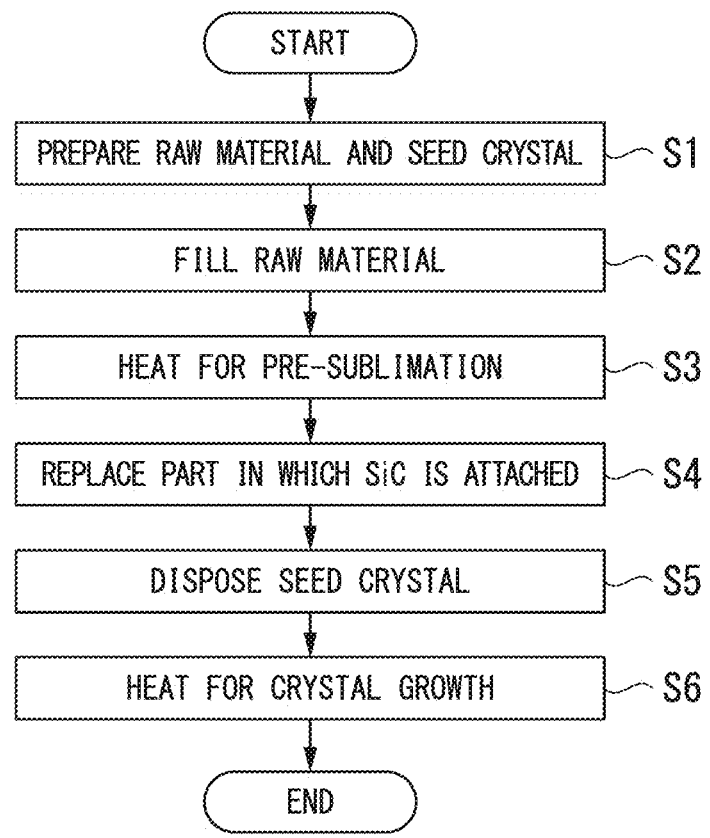
FIG. 2 is a flowchart showing an example of a method of producing an n-type 4H-SiC single crystal substrate according to the present embodiment.

FIG. 2 is a flowchart showing an example of a method of producing an n-type 4H-SiC single crystal substrate according to the present embodiment. In the present embodiment, a method of producing an n-type 4H-SiC single crystal substrate in which the donor is nitrogen (N) and the acceptor is boron (B) is described as an example, but the donor and the acceptor are not limited to nitrogen and boron.

As shown in FIG. 2, first, the raw material A1 containing a silicon source (Si), a carbon source (C), and an element as an acceptor and the seed crystal B1 are prepared (Step S1), and the container body 12 of the crucible 14 is filled with the raw material A1 (Step S2). The raw material A1 is produced by, for example, mixing SiC powder and $B_4C$ powder. In this case, a content (amount prepared) of $B_4C$ in the raw material A1 can be 0.001 to 5 mass %, and more preferably 0.01 to 0.04 mass %.

Next, the raw material A1 which the crucible 14 is filled with is heated using the high frequency coil 11 and 0.1 mass % or more of the raw material A1 containing the element B as an acceptor is pre-sublimated in the crucible 14 (Step S3). The raw material A1 in pre-sublimation can be heated under conditions of 2,000 to 2,500° C. and for 1 to 100 hours. When 0.1 mass % or more of the raw material A1 containing the element B is pre-sublimated, in a crystal growth process to be described below, it is possible to prevent the concentration of the element B in the grown crystal from increasing in an initial stage of crystal growth. Then, a part where SiC is attached according to sublimation and re-crystallization is removed or replaced (Step S4).

Next, the seed crystal B1 is disposed to face the raw material A1 (Step S5). Then, a mixed gas containing the element N as a donor is supplied into the crucible 14, the pre-sublimated raw material A1 is heated using a heat source 11, the pre-sublimated raw material A1 is sublimated in the crucible 14, and a single crystal layer is grown on the surface of the seed crystal B1 (Step S6). Then, a substrate with a predetermined thickness is cut out from the obtained n-type 4H-SiC single crystal.

Although the crucible 14 is in a sealed state, a gas can flow into the crucible 14 from the outside, and when a mixed gas containing the element N as a donor fills the space 16, the mixed gas is supplied into the crucible 14. A partial pressure ratio of nitrogen gas in the mixed gas can be 0 to 100%. In addition, the raw material A1 in crystal growth can be heated under conditions of 2,000 to 2,500° C. and for 10 hours to 300 hours, and preferably 2,200 to 2,400° C. and for 50 hours to 200 hours. When the single crystal layer is grown on the surface of the seed crystal B1 under such conditions, an n-type 4H-SiC single crystal substrate in which nitrogen (N) and boron (B) are co-doped is produced.

In the n-type 4H-SiC single crystal substrate obtained by the production method according to the present embodiment, the concentration of a donor element and the concentration of an acceptor element are both $3.0 \times 10^{18}/cm^3$ or more, and a density of threading dislocation (hereinafter referred to as "TD") is less than $4,000/cm^2$. For example, according to the production method shown in FIG. 2, an n-type 4H-SiC single crystal substrate can be obtained in which the concentration of the element N as a donor and the concentration of the element B as an acceptor are both $3.0 \times 10^{18}/cm^3$ or more and a threading dislocation density is less than $4,000/cm^2$.

In the present embodiment, the threading dislocation (TD) includes dislocations such as threading screw dislocation having a Burgers vector of <0001>, threading edge dislocation having a Burgers vector of 1/3<11-20>, and threading mixed dislocation having these Burgers vectors in combination. All of the threading screw dislocation (hereinafter referred to as "TSD"), the threading edge dislocation (hereinafter referred to as "TED") and the threading mixed dislocation (hereinafter referred to as "TMD") are dislocations that extend in a direction (c-axis direction) perpendicular to a base surface, and it is important to prevent the threading dislocation from increasing because it affects the reliability of the device and shortening of the carrier lifetime.

As described above, dislocation of a crystal includes basal plane dislocation (BPD) and double Shockley-type stacking faults (DSSF). However, BPD and DSSF are different from TSD, TED or TMD in that they are dislocations that extend in the in-plane direction of the base surface.

The concentration of the acceptor element is preferably $3.0 \times 10^{18}/cm^3$ or more and less than $2.0 \times 10^{19}/cm^3$. For example, when the acceptor element is boron (B), the concentration of the element B is preferably $3.0 \times 10^{18}/cm^3$ or more and less than $2.0 \times 10^{-9}/cm^3$ and more preferably $3.0 \times 10^{18}/cm^3$ or more and $1.4 \times 10^{19}/cm^3$ or less.

Figure 3A:
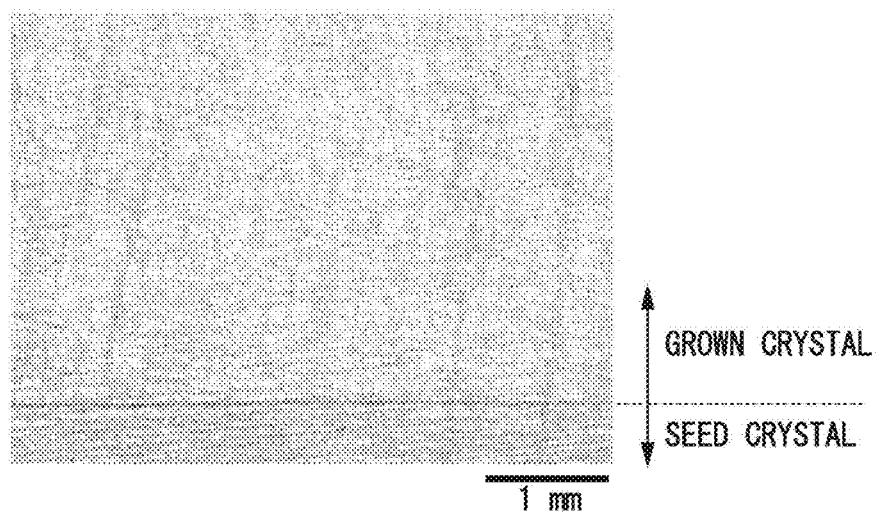
FIG. 3A shows an X-ray topographic image of a cross section of an n-type 4H-SiC single crystal substrate when a raw material is pre-sublimated in the method of producing an n-type 4H-SiC single crystal substrate according to the present embodiment.
Figure 3B:
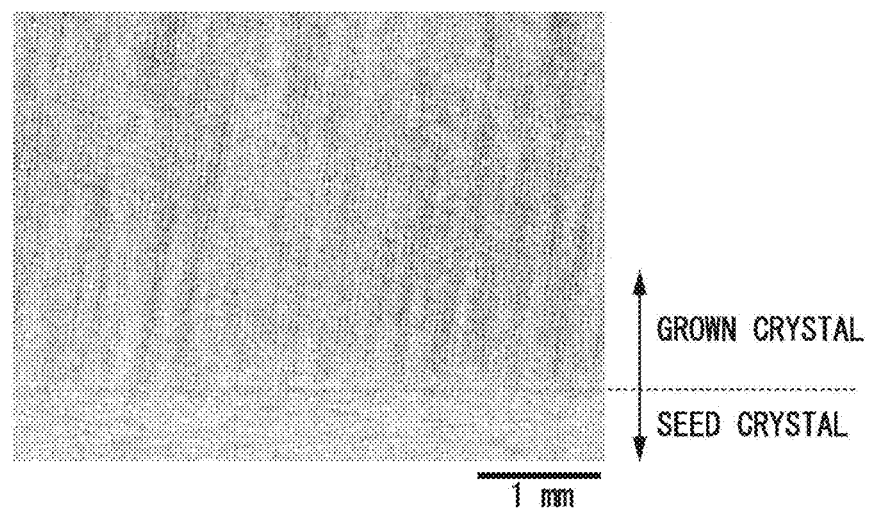
FIG. 3B shows an X-ray topographic image of a cross section of an n-type 4H-SiC single crystal substrate when a raw material is not pre-sublimated.

FIG. 3A shows an X-ray topographic image (g=-1-120) of a cross section of an example of an n-type 4H-SiC single crystal substrate when a raw material is pre-sublimated in the method of producing an n-type 4H-SiC single crystal substrate according to the present embodiment. FIG. 3B shows an X-ray topographic image of a cross section of an example of an n-type 4H-SiC single crystal substrate when a raw material is not pre-sublimated. In production of the n-type 4H-SiC single crystal substrate in FIG. 3A, the amount of $B_4C$ in the raw material is 0.03 wt %, and the amount of the raw material sublimated according to pre-sublimation is 1.5 mass %.

As shown in FIG. 3A, in the n-type 4H-SiC single crystal substrate when a raw material is pre-sublimated, there are few threading dislocations that extend in a direction perpendicular to the base surface in the grown crystal. In addition, a small number of threading dislocations in the grown crystal are generated at approximately the same positions as some of the threading dislocations present in the seed crystal. Therefore, it is found that the threading dislocations in the grown crystal are caused due to crystal dislocations present in the seed crystal, and there are almost no newly generated threading dislocations regardless of the seed crystal.

On the other hand, in the n-type 4H-SiC single crystal substrate when a raw material is not pre-sublimated, as shown in FIG. 3B, it is found that there are a great number of threading dislocations that extend in a direction perpendicular to the base surface in the grown crystal, and most of them are threading dislocations that are newly generated regardless of the seed crystal. Therefore, it is found that, when a raw material is pre-sublimated, it is possible to significantly reduce the number of threading dislocations in the grown crystal.

Figure 4:
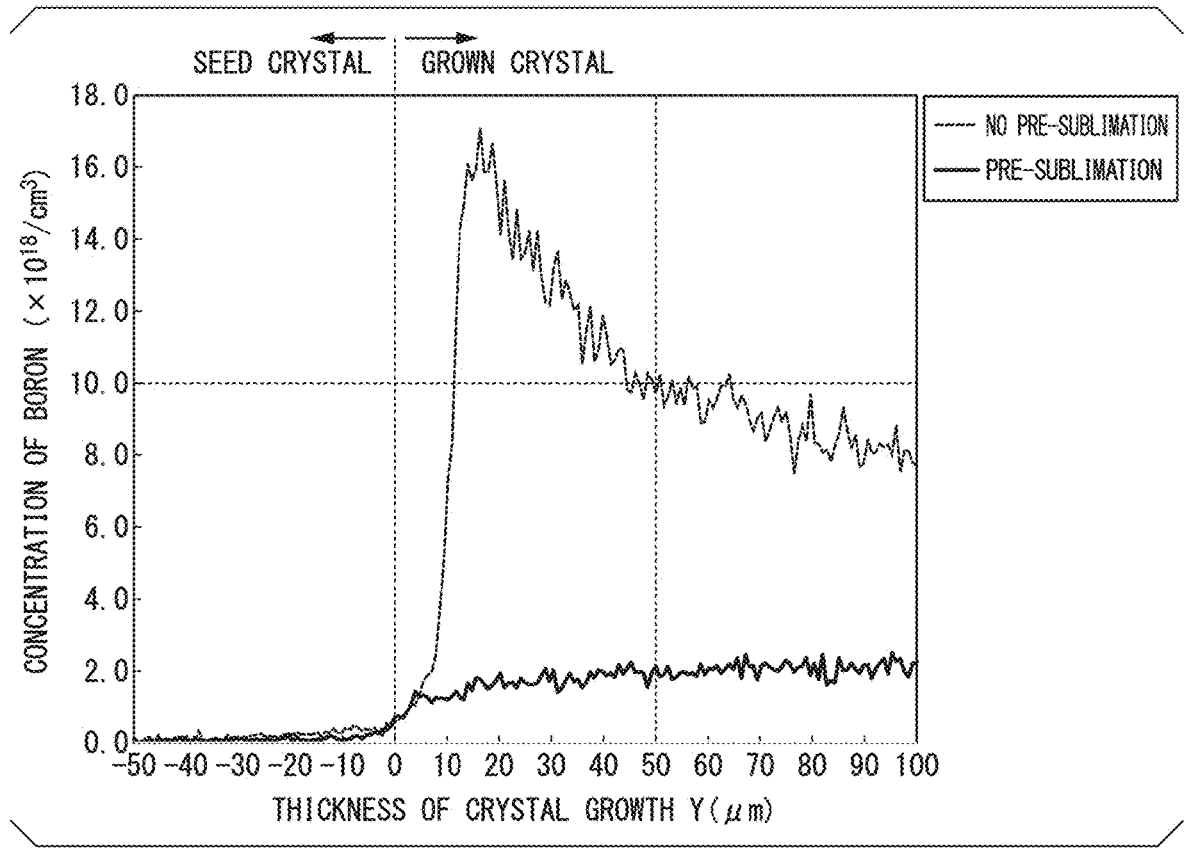
FIG. 4 is a graph showing the relationship between the growth thickness of an n-type 4H-SiC single crystal substrate measured through TOF-SIMS spectrometry and the concentration of boron.

FIG. 4 is a graph showing the relationship between the position of the n-type 4H-SiC single crystal substrate in the thickness direction measured through time-of-flight secondary ion mass spectrometry (TOF-SIMS spectrometry) and the concentration of boron. In FIG. 4, based on an interface (Y=0 μm) between the seed crystal and the grown crystal, the side of the seed crystal is negative, and the side of the grown crystal is positive.

As shown in FIG. 4, in the n-type 4H-SiC single crystal substrate when a raw material is pre-sublimated, while the concentration of boron on the side of the grown crystal gradually increases from the vicinity of the interface, it hardly changes at about $2.0 \times 10^{18}/cm^3$ in a range of Y=30 μm to 100 μm.

On the other hand, in the n-type 4H-SiC single crystal substrate when a raw material is not pre-sublimated, the concentration of boron on the side of the grown crystal sharply increases in the vicinity of the interface, particularly in a range of Y=10 μm to 20 μm.

Based on the results of FIGS. 3A, 3B and FIG. 4, it is inferred that, when a mixture containing $B_4C$ powder is used as a raw material, a large amount of boron is sublimated in the initial stage during crystal growth, an excess amount of boron is incorporated into the crystal, a change in the lattice constant due to the excess amount of boron occurs, and new threading dislocations are generated due to the strain caused by a difference in lattice constant between the seed crystal and the grown crystal. Therefore, it is inferred that, in the initial stage during crystal growth, that is, when an increase in the concentration of boron in the vicinity of the interface between the single crystal and the grown crystal is prevented, the number of threading dislocations in the grown crystal can be reduced.

Regarding a method of preventing the concentration of boron in the vicinity of the interface between the single crystal and the grown crystal from increasing, the above method of performing pre-sublimating is typically exemplified, but other methods may be used. For example, a method in which the type of $B_4C$ powder, for example, the particle size and the shape are changed, a method in which a gas containing the element B as an acceptor (any of diborane, trimethylborane, and triethylborane) is supplied into a crucible from the outside in place of $B_4C$ powder, and the concentration of the gas is controlled are conceivable. In addition, it is conceivable that a seed crystal doped with boron (B) is used, and even if the concentration of boron increases in the vicinity of the interface between the seed crystal and the grown crystal, there is no change in lattice constant.

Figure 5:
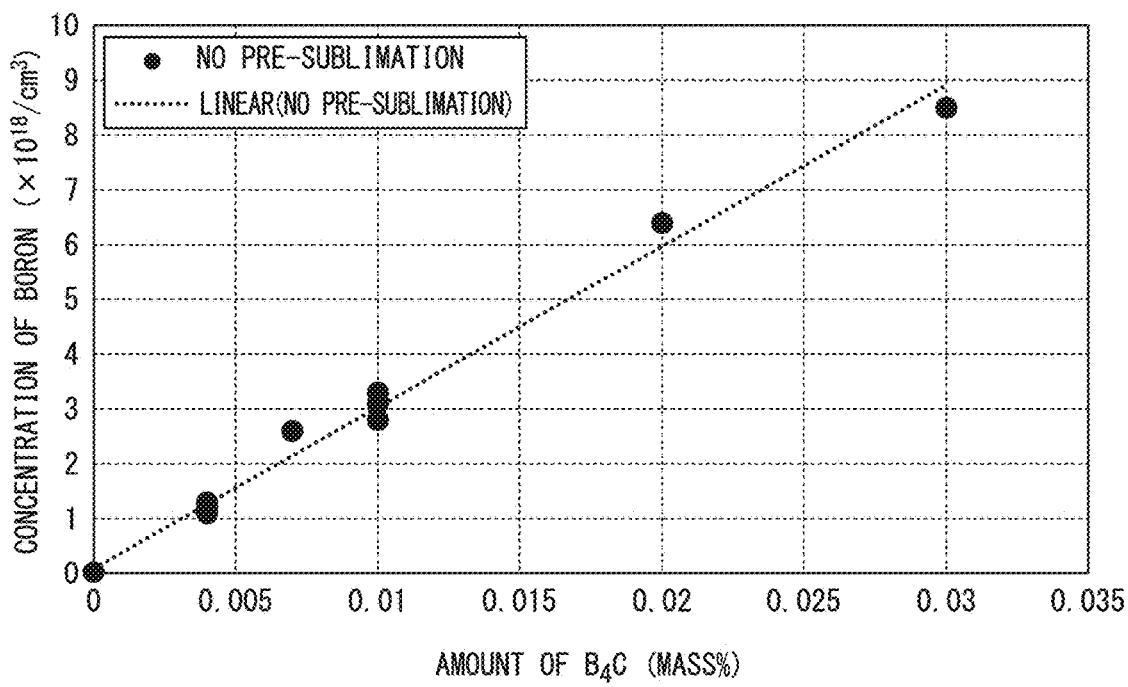
FIG. 5 is a graph showing the relationship between the amount of $B_4C$ powder in a raw material when the raw material is not pre-sublimated and the concentration of boron in the n-type 4H-SiC single crystal substrate.

FIG. 5 is a graph showing the relationship between the amount of $B_4C$ powder in a raw material when the raw material is not pre-sublimated and the concentration of boron in the n-type 4H-SiC single crystal substrate. In FIG. 5, the pressure in the crucible during crystal growth is 5 Torr.

The amount of $B_4C$ powder in the raw material and the concentration of boron in the n-type 4H-SiC single crystal substrate vary depending on crystal growth conditions (temperature, pressure, etc.) and whether pre-sublimation is performed. However, there is a correlation between the amount of $B_4C$ powder in the raw material when no pre-sublimation is performed and the concentration of boron in the n-type 4H-SiC single crystal substrate, and the concentration of boron is approximately linear with respect to the amount of $B_4C$ powder. Therefore, it can be inferred that, even if pre-sublimation is performed, the concentration of boron in the n-type 4H-SiC single crystal substrate is approximately linear with respect to the amount of $B_4C$ powder in the raw material.

Therefore, when pre-sublimation is performed, the concentration of boron in the n-type 4H-SiC single crystal substrate can be increased by increasing the amount of $B_4C$ powder in the raw material. Based on this inference, for example, when the amount of $B_4C$ (amount prepared) in the raw material is set to 0.01 to 0.04 mass %, and 0.1 mass % or more of the raw material is pre-sublimated, it is possible to obtain an n-type 4H-SiC single crystal substrate in which the concentration of the element N as a donor and the concentration of the element B as an acceptor are both $3.0 \times 10^{18}/cm^3$ or more, and the threading dislocation density is less than $4,000/cm^2$.

As described above, according to the present embodiment, since the concentration of a donor element and the concentration of an acceptor element are both $3.0 \times 10^{18}/cm^3$ or more, and the threading dislocation density is less than $4,000/cm^2$, in the n-type 4H-SiC single crystal substrate in which a donor and an acceptor are co-doped, the threading dislocation density is low and the crystallinity can be improved compared to the related art.

Example 1

Examples of the present disclosure will be described below. The present disclosure is not limited to the following examples.

Example 1

A raw material in which an amount of $B_4C$ powder prepared was 0.03 mass % was prepared and 1.5 mass % of the raw material was pre-sublimated in a crucible for 10 hours. Then, a seed crystal was placed in a lid section in the crucible, a gas with a partial pressure ratio of nitrogen gas of 100% was supplied into the crucible, the raw material was sublimated in the crucible, a crystal was grown on the seed crystal, and thereby an n-type 4H-SiC single crystal substrate in which nitrogen (N) and boron (B) were co-doped was obtained.

Next, the concentration of nitrogen and the concentration of boron in the obtained n-type 4H-SiC single crystal substrate were measured through secondary ion mass spectrometry. In addition, etch pits of TD were formed by an etching method using molten potassium hydroxide, and observed under a reflection microscope, and the density of a circular or hexagonal etch pit, that is, a TD density, was measured. In addition, in the vicinity of the interface between the seed crystal and the grown crystal, it was evaluated whether the threading dislocation density increased through X-ray topography (device name "UltraX 18" commercially available from Rigaku. Corporation). The results are shown in Table 1.

Comparative Examples 1 to 5

The amount of $B_4C$ powder prepared was 0 or the amount of $B_4C$ powder prepared was changed, and thereby n-type 4H-SiC single crystal substrates in which nitrogen (N) and boron (B) with various concentrations were co-doped were obtained. In addition, in the same method as in Example 1, the concentration of nitrogen and the concentration of boron in the n-type 4H-SiC single crystal substrates, the TD density, and whether the threading dislocation density increased in the vicinity of the interface between the seed crystal and the grown crystal were measured. The concentration of nitrogen and the concentration of boron were measured not in the vicinity of the interface between the seed crystal and the grown crystal but in a part where a crystal was grown 3 mm to 15 mm from the interface. The results are shown in Table 1.

TABLE 1

| | Amount of $B_4C$ prepared [mass %] | Whether pre-sublimation is performed | Concentration of nitrogen [$\times 10^{18}/cm^3$] | Concentration of boron [$\times 10^{18}/cm^3$] | Threading dislocation (TD) density [numbers/$cm^2$] | Increase in threading dislocation density in the vicinity of interface |
|---|---|---|---|---|---|---|
| Comparative Example 1 | 0 | Not performed | — | *<0.3* | 1,400 | No increase |
| Comparative Example 2 | 0.007 | Not performed | 37 | *2.6* | 3,100 | No increase |
| Comparative Example 3 | 0.01 | Not performed | 31 | 3.1 | *100,000* | Increase |
| Comparative Example 4 | 0.02 | Not performed | 42 | 7.2 | *14,000* | Increase |
| Comparative Example 5 | 0.03 | Not performed | 42 | 9.3 | *7,900* | Increase |
| Example 1 | 0.03 | Performed | 45 | 14 | 3,200 | No increase |
| Comparative Example 6 | 0.05 | Performed | 43 | *20* | *5,600* | Increase |

Note:
in the table, italic and bold values indicate that they are outside the range of the present disclosure Based on the results of Table 1, in Example 1, 1.5 mass % of a raw material in which an amount of $B_4C$ prepared was 0.03 mass % was pre-sublimated, and thereby an n-type 4H-SiC single crystal substrate in which the concentration of nitrogen was $4.5 \times 10^{19}/cm^3$, the concentration of boron was $1.4 \times 10^{19}/cm^3$ in the n-type 4H-SiC single crystal substrate, the threading dislocation (TD) density was $3,200/cm^2$, and the crystallinity was improved compared to the related art was obtained. Accordingly, in Example 1, it was possible to achieve both doping of boron with a high concentration and a threading dislocation density of less than $4,000/cm^2$. Here, the concentration of boron varied depending on a pressure and temperature growth environment, and a deviation occurred from the relationship in FIG. 5. In addition, no increase in threading dislocation density in the vicinity of the interface between the seed crystal and the grown crystal due to pre-sublimation was observed.

On the other hand, in Comparative Example 1, while an amount of $B_4C$ powder prepared was 0, and the TD density was small at 1,400/cm$^2$, no boron was doped in the n-type 4H-SiC single crystal substrate. Here, in Patent Document 3, the effectiveness of pre-sublimation for reducing hollow defects in the SiC single crystal growth is described. However, in Comparative Example 1, it was found that it was possible to form a SiC single crystal having favorable crystallinity without pre-sublimation. Therefore, pre-sublimation was not essential for formation of a SiC single crystal in which no boron was doped itself. Although details were unknown, it was estimated that the above-described differences were caused due to differences in temperature and pressure during crystal growth and shape of SiC powder and the like used in examples and comparative examples with respect to Patent Document 3.

In Comparative Example 2, an amount of B$_4$C powder prepared was 0.007 mass %, and the concentration of boron in the n-type 4H-SiC single crystal substrate was lower than a target doping amount. In this case, the concentration of boron was $2.6 \times 10^{18}$/cm$^3$, and the TD density was 3,100/cm$^2$. In addition, no increase in threading dislocation density in the vicinity of the interface between the seed crystal and the grown crystal was observed. That is, when the concentration of boron was less than $3.0 \times 10^{18}$/cm$^3$, as shown in Comparative Examples 1 and 2, there was no problem of the TD density increasing.

In Comparative Example 3, while an amount of B$_4$C powder prepared was 0.01 mass %, and the concentration of nitrogen and the concentration of boron in the n-type 4H-SiC single crystal substrate were favorable, the TD density was significantly inferior because there was no pre-sublimation. In this case, the concentration of boron was $3.1 \times 10^{18}$/cm$^3$, and the TD density was 100,000/cm$^2$. In addition, an increase in threading dislocation density in the vicinity of the interface between the seed crystal and the grown crystal was observed. That is, according to Comparative Example 3, the inventors found that, when the concentration of boron was $3.0 \times 10^{18}$/cm$^3$ or more, the TD density increased (object of the disclosure).

In Comparative Example 4, while an amount of B$_4$C powder prepared was 0.02 mass %, and the concentration of nitrogen and the concentration of boron in the n-type 4H-SiC single crystal substrate were favorable, the TD density was inferior. In this case, the concentration of boron was $7.2 \times 10^{18}$/cm$^3$, and the TD density was 14,000/cm$^2$. In addition, an increase in threading dislocation density in the vicinity of the interface between the seed crystal and the grown crystal was observed. The TD density increased because there was no pre-sublimation.

In Comparative Example 5, while an amount of B$_4$C powder prepared was 0.03 mass %, and the concentration of nitrogen and the concentration of boron in the n-type 4H-SiC single crystal substrate were favorable, the TD density was inferior. In this case, the concentration of boron was $9.3 \times 10^{18}$/cm$^3$ which is large about 3 times $3 \times 10^{18}$/cm$^3$. The TD density was 7,900/cm$^2$ and exceeded 4,000/cm$^2$. In addition, an increase in threading dislocation density in the vicinity of the interface between the seed crystal and the grown crystal was observed. In Comparative Examples 3 to 5, since there was no pre-sublimation as in the results of FIG. 4, it was conceivable that an increase in threading dislocation density was caused due to an increase in the concentration of boron in the vicinity of the interface between the seed crystal and the grown crystal.

In Comparative Example 6, while there was pre-sublimation, since an amount of B$_4$C powder prepared was 0.05 mass %, the concentration of boron in the n-type 4H-SiC single crystal substrate was high, and the TD density was inferior. In this case, the concentration of boron was $2.0 \times 10^{19}$/cm$^3$, and the TD density was 5,600/cm$^2$. Even if pre-sublimation was performed, when the concentration of boron $2.0 \times 10^{19}$/cm$^3$ or more, the TD density increased to 4,000/cm$^2$ or more. In addition an increase in threading dislocation density in the vicinity of the interface between the seed crystal and the grown crystal was observed. Therefore, it was conceivable that the concentration of boron was less than $2.0 \times 10^{19}$ cm$^3$ in a range in which the TD density did not increase. It was conceivable that the concentration of boron was more preferably $1.4 \times 10^{19}$ cm$^3$ or more according to Example 1.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

What is claimed is:

1. An n-type 4H-SiC single crystal substrate in which a concentration of a donor element and a concentration of an acceptor element are both $3.0 \times 10^{18}$/cm$^3$ or more, and a threading dislocation density is less than 4,000/cm$^2$,
    wherein the threading dislocation includes threading screw dislocation, threading edge dislocation, and threading mixed dislocation.

2. The n-type 4H-SiC single crystal substrate according to claim 1, wherein the concentration of the acceptor element is $3.0 \times 10^{18}$/cm$^3$ or more and less than $2.0 \times 10^{19}$/cm$^3$.

3. The n-type 4H-SiC single crystal substrate according to claim 1,
    wherein the acceptor element is boron (B).

4. The n-type 4H-SiC single crystal substrate according to claim 2,
    wherein the acceptor element is boron (B).

5. The n-type 4H-SiC single crystal substrate according to claim 1,
    wherein the donor element is nitrogen (N).

6. A method of producing an n-type 4H-SiC single crystal substrate according to claim 1, comprising:
    a process of filling a crucible with a raw material containing a silicon source (Si), a carbon source (C), and an element as an acceptor;
    a process of pre-sublimating 0.1 mass% or more of the raw material in the crucible;
    a process of disposing a seed crystal to face the raw material; and
    a process of supplying a gas containing an element as a donor into the crucible, sublimating the pre-sublimated raw material in the crucible, and allowing a single crystal layer to grow on a surface of the seed crystal.

7. The method of producing an n-type 4H-SiC single crystal substrate according to claim 6, wherein the acceptor is boron (B).

8. The method of producing an n-type 4H-SiC single crystal substrate according to claim 6,
    wherein the donor is nitrogen (N).

* * * * *